US010724673B1

(12) United States Patent
Kho et al.

(10) Patent No.: US 10,724,673 B1
(45) Date of Patent: Jul. 28, 2020

(54) MOUNTING SYSTEMS FOR A VIDEO-CONFERENCING DEVICE, VIDEO CONFERENCING SYSTEMS, AND RELATED METHODS

(71) Applicant: Facebook, Inc., Menlo Park, CA (US)

(72) Inventors: ChuanKeat Kho, San Jose, CA (US); Chenyu Xu, Fremont, CA (US)

(73) Assignee: Facebook, Inc., Menlo Park, CA (US)

( * ) Notice: Subject to any disclaimer, the term of this patent is extended or adjusted under 35 U.S.C. 154(b) by 0 days.

(21) Appl. No.: 16/116,880

(22) Filed: Aug. 29, 2018

(51) Int. Cl.
| | | |
|---|---|---|
| F16M 11/04 | (2006.01) | |
| H04N 5/655 | (2006.01) | |
| H04N 7/14 | (2006.01) | |
| H04N 7/15 | (2006.01) | |
| H05K 5/02 | (2006.01) | |
| F16M 13/02 | (2006.01) | |

(52) U.S. Cl.
CPC .......... *F16M 11/045* (2013.01); *H04N 5/655* (2013.01); *H04N 7/142* (2013.01); *H04N 7/15* (2013.01); *H05K 5/0234* (2013.01); *F16M 13/02* (2013.01)

(58) Field of Classification Search
CPC .... F16M 11/045; F16M 13/02; F16M 13/022; F16M 11/00; F16M 11/22; H04N 5/655; H04N 7/15; H04N 7/142; H04N 5/64; H05K 5/0234; H05K 7/18; G06F 1/1607
See application file for complete search history.

(56) References Cited

U.S. PATENT DOCUMENTS

| | | | | |
|---|---|---|---|---|
| 5,484,197 | A * | 1/1996 | Hansen | A47B 88/42 312/334.12 |
| 7,921,516 | B2 * | 4/2011 | Chuan | G06F 1/1601 16/239 |
| 8,638,548 | B2 * | 1/2014 | Gardes | H04N 5/64 248/122.1 |
| 10,492,320 | B2 * | 11/2019 | Schweizer | F16M 13/022 |
| 2007/0170327 | A1 * | 7/2007 | Hayes | B63B 17/00 248/286.1 |
| 2009/0090825 | A1 * | 4/2009 | Jung | G06F 1/1601 248/205.1 |
| 2009/0294599 | A1 * | 12/2009 | Chen | G06F 1/1607 248/65 |
| 2010/0005625 | A1 * | 1/2010 | Chuan | G06F 1/1601 16/364 |
| 2010/0014230 | A1 * | 1/2010 | Horie | G06F 1/16 361/679.01 |
| 2010/0271764 | A1 * | 10/2010 | Gardes | G06F 1/1607 361/679.01 |
| 2011/0063789 | A1 * | 3/2011 | Ma | G06F 1/1601 361/679.21 |
| 2013/0092805 | A1 * | 4/2013 | Funk | F16M 13/02 248/121 |

(Continued)

FOREIGN PATENT DOCUMENTS

CN 203368658 U * 12/2013

*Primary Examiner* — Ko H Chan
(74) *Attorney, Agent, or Firm* — FisherBroyles, LLP

(57) ABSTRACT

The disclosed mounting systems may include a rail assembly, a cradle, and at least one bracket. The rail assembly may include at least one base rail element and at least one sliding rail element. The cradle may be configured to couple to the sliding rail element. The bracket may be configured to support a video-conferencing device and to couple to the cradle. Various other related methods and systems are also disclosed.

20 Claims, 6 Drawing Sheets

(56) References Cited

U.S. PATENT DOCUMENTS

| | | | |
|---|---|---|---|
| 2014/0233205 A1* | 8/2014 | Gardes | G06F 1/1607 |
| | | | 361/825 |
| 2019/0203878 A1* | 7/2019 | Deng | F16M 11/041 |
| 2019/0226635 A1* | 7/2019 | Sung | F16M 11/04 |
| 2019/0249824 A1* | 8/2019 | Floe | F16B 2/065 |
| 2019/0261525 A1* | 8/2019 | Chiu | F16M 11/046 |
| 2019/0271437 A1* | 9/2019 | Smith | B44D 3/00 |

\* cited by examiner

600

```
┌─────────────────────────────────────────────────┐
│ Coupling at least one base rail element to a    │
│ support structure at least partially behind a   │
│ video-conferencing display                      │
│ 610                                             │
└─────────────────────────────────────────────────┘
                      ↓
┌─────────────────────────────────────────────────┐
│ Coupling a cradle to at least one sliding rail  │
│ element that is slidably coupled to the at      │
│ least one base rail element                     │
│ 620                                             │
└─────────────────────────────────────────────────┘
                      ↓
┌─────────────────────────────────────────────────┐
│ Coupling a video-conferencing device to the     │
│ cradle                                          │
│ 630                                             │
└─────────────────────────────────────────────────┘
                      ↓
┌─────────────────────────────────────────────────┐
│ Sliding the video-conferencing device with the  │
│ sliding rail element to a position behind the   │
│ video-conferencing display                      │
│ 640                                             │
└─────────────────────────────────────────────────┘
```

*FIG. 6*

MOUNTING SYSTEMS FOR A VIDEO-CONFERENCING DEVICE, VIDEO CONFERENCING SYSTEMS, AND RELATED METHODS

BACKGROUND

Video-conferencing systems are used in business and other settings to connect people who are in different locations for meetings, collaboration, and other communications. Video-conferencing systems typically include a display screen and a video-conferencing processing device, which may process and transmit incoming and outgoing video and audio signals to enable participants to communicate with each other. Such processing devices may be positioned behind the associated display screens to hide them from view during normal operation.

Display screens for video-conferencing may be relatively heavy, and some display screens and processing devices may be wall-mounted at or above waist-height. Thus, significant physical effort and/or more than one person may be required for accessing video-conferencing processing devices for installation, maintenance, adjustments, or removal. In addition, installation or removal of the processing devices may require the use of tools to secure the devices to a wall or other supporting structure, and may be performed in tight spaces (e.g., behind the display screens).

SUMMARY

As will be described in greater detail below, the instant disclosure describes mounting systems and video-conferencing systems that include a rail assembly, a cradle, and at least one bracket for easily and securely supporting video-conferencing devices. Related methods of mounting video-conferencing devices are also disclosed.

In some examples, the present disclosure includes mounting systems for a video-conferencing device. Such mounting systems may include a rail assembly, a cradle, and at least one bracket. The rail assembly may include at least one base rail element and at least one sliding rail element. The cradle may be configured to couple to the sliding rail element. The bracket may be configured to support a video-conferencing device and to couple to the cradle.

In some embodiments, the rail assembly may include an upper base rail element, an upper sliding rail element slidably coupled to the upper base rail element, a lower base rail element, and a lower sliding rail element slidably coupled to the lower base rail element. The rail assembly may also include least one vertical support element configured to couple to and extend between the upper base rail element and the lower base rail element. The rail assembly may also include at least one intermediate rail element slidably coupled to the base rail element and to the sliding rail element. The rail assembly may also include at least one locking mechanism to hold the rail assembly in at least one of an extended position or a retracted position. The at least one locking mechanism may include a push-to-lock mechanism to hold the rail assembly in the retracted position, and a pull-to-lock mechanism to hold the rail assembly in the extended position.

In some embodiments, the cradle may be configured to couple to the sliding rail element via at least one fastener. The cradle may include a plurality of holes positioned for engagement with a plurality of different mounting structures. The cradle may and the bracket may be configured to removably couple to each other.

In some examples, the present disclosure includes video-conferencing systems. Such systems may include a video-conferencing device comprising at least video and audio outputs and video and audio inputs, a rail assembly, a cradle, and at least one bracket. The rail assembly may include at least one base rail element and at least one sliding rail element, the rail assembly configured to position the video-conferencing device behind a video-conferencing display when in a retracted position and to position the video-conferencing device at least partially exposed relative to the video-conferencing display when in an extended position. The cradle may be configured to couple to the sliding rail element. The at least one bracket may be configured to support the video-conferencing device on the rail assembly via the cradle.

In some embodiments, the at least one bracket may include a top bracket that is configured to couple to a top portion of the chassis of the video-conferencing device and a bottom bracket that is configured to couple to a bottom portion of the chassis. Each of the top bracket and the bottom bracket may be configured to removably engage with the cradle. A fastener may removably couple the at least one bracket to the cradle. The cradle may include at least two holes for coupling to the sliding rail element. The rail assembly may be configured to position the video-conferencing device fully exposed relative to the video conferencing display when in the extended position.

In some examples, the rail assembly may include an upper base rail element, an upper sliding rail element slidably coupled to the upper base rail element, a bottom base rail element, and a bottom sliding rail element slidably coupled to the bottom base rail element. The rail assembly may also include an upper intermediate rail element that is slidably coupled to both the upper base rail element and the upper sliding rail element, and a bottom intermediate rail element that is slidably coupled to both the bottom base rail element and the bottom sliding rail element. The cradle may be configured to couple to both the upper sliding rail element and the bottom sliding rail element. The rail assembly may also include at least one locking mechanism configured to retain the rail assembly in at least one of the retracted position or the extended position absent a sufficient external releasing force.

In some examples, the present disclosure includes methods of mounting a video-conferencing device. In accordance with such methods, at least one base rail element may be coupled to a support structure at least partially behind a video-conferencing display. A cradle may be coupled to the at least one sliding rail element that is slidably coupled to the at least one base rail element. A video-conferencing device may be coupled to the cradle. The video-conferencing device may be slid with the sliding rail element to a position behind the video-conferencing display.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

FIG. 6 is a flow diagram of an example method of mounting a video-conferencing device according to some embodiments of this disclosure.

Figure 1:
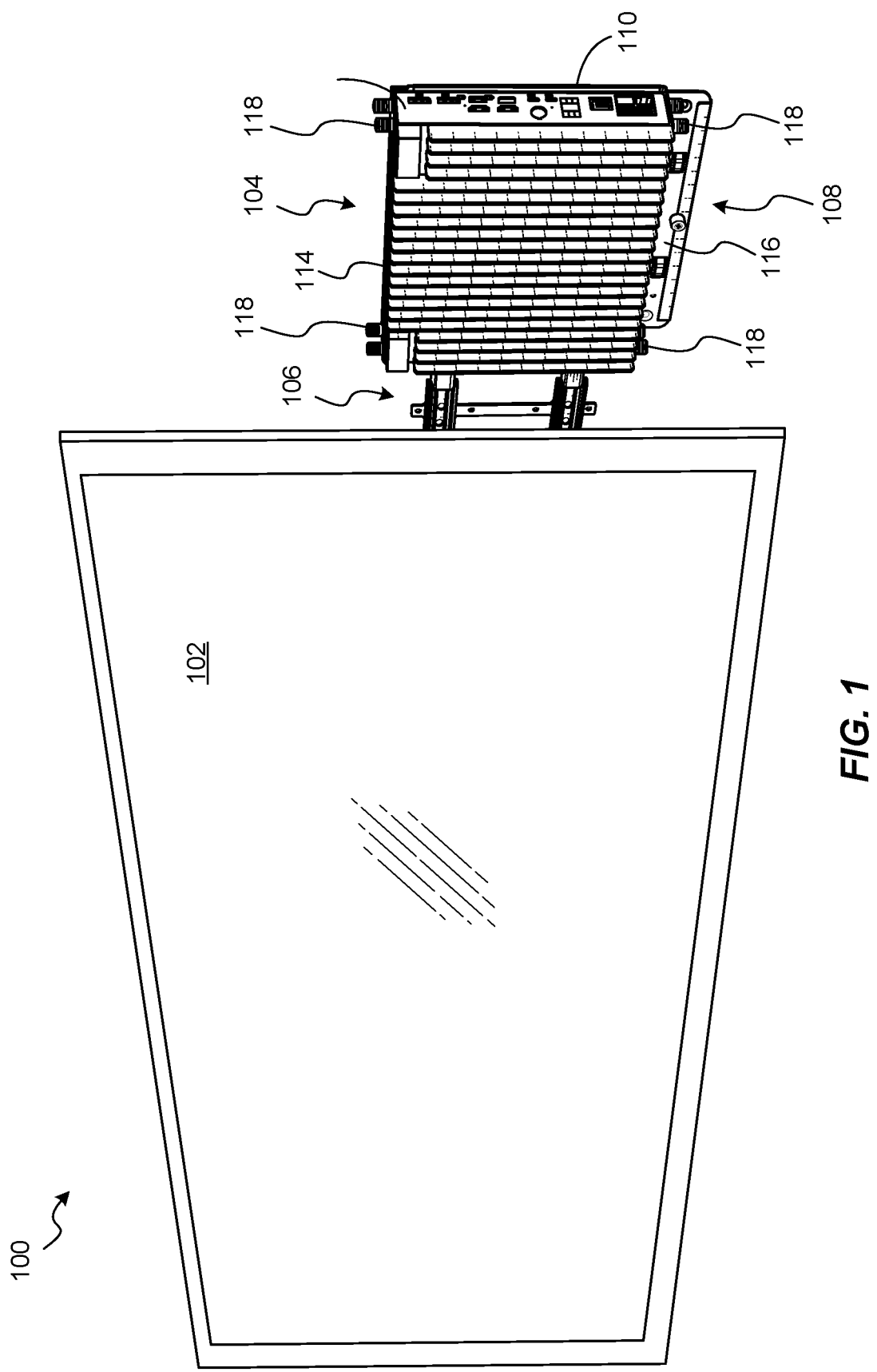
FIG. 1 is a perspective view of a video-conferencing system according to embodiments of this disclosure.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXAMPLE EMBODIMENTS

The present disclosure is generally directed to mounting systems for video-conferencing devices, video-conferencing systems, and methods of mounting video-conferencing devices. As will be explained in greater detail below, embodiments of this disclosure may include mounting systems that include a rail assembly including a sliding rail element, a cradle configured to couple to the sliding rail element, and at least one bracket configured to support a video-conferencing device and to couple to the cradle. Embodiments of the disclosure may facilitate installation, storage, and removal of video-conferencing devices, such as behind video-conferencing displays. For example, example mounting systems according to this disclosure may be capable of securely supporting a video-conferencing device in a position that is out-of-view, while enabling easy access to the video-conferencing device as needed.

The following will provide, with reference to FIG. 1, detailed descriptions of a video-conferencing system. Detailed descriptions of example video-conferencing devices and mounting systems will be provided with reference to FIGS. 2-5. The discussion related to FIG. 6 will provide detailed descriptions of example methods of mounting video-conferencing devices.

FIG. 1 is a perspective view of a video-conferencing system 100 according to embodiments of this disclosure. The video-conferencing system 100 may include a video-conferencing display 102 and a video-conferencing device 104. The video-conferencing device 104 may be mounted to be positioned at least partially (i.e., partially or fully) behind the video-conferencing display 102 when in use. In some examples, the video-conferencing device 104 may be mounted on a rail assembly 106, such as to slide between a maintenance or installation position at least partially exposed from behind the video-conferencing display 102 (as shown in FIG. 1) and an operational position behind the video-conferencing display 102. As explained below, however, the video-conferencing system 100 may be configured for additional and different mounting options.

The video-conferencing display 102 may be, for example, an electronic display (e.g., LED display, LCD display, plasma display, etc.) or a projector screen. In some examples, the video-conferencing display 102 may be positioned in a conference room for use in video-conferencing with remote systems and users.

The video-conferencing device 104 may be supported (e.g., on the rail assembly 106) by a mounting system 108. The mounting system 108 may include a cradle 110 that may support the video-conferencing device 104 and may couple the video-conferencing device 104 to the rail assembly 106 or to another mounting structure (e.g. directly to a wall, to a Video Electronics Standards Association (VESA) mount, to a wall mount, to a horizontal monitor screen mount, etc.). For example, a chassis 112 of the video-conferencing device 104 may be coupled (e.g., removably coupled) to the cradle 110 via a top bracket 114 and a bottom bracket 116. Each of the top bracket 114 and the bottom bracket 116 may be secured to the chassis 112, such as with thumb screws 118. The thumb screws 118 or other suitable fasteners may, for example, extend into corresponding holes formed in the chassis 112. The cradle 110 may be secured to the rail assembly 106, which may in turn be secured to a wall for supporting the video-conferencing device 104. Further explanations of embodiments of the video-conferencing device 104 and example mounting systems for the video-conferencing device 104 are provided below, such as with reference to FIGS. 2-8.

Figure 2:
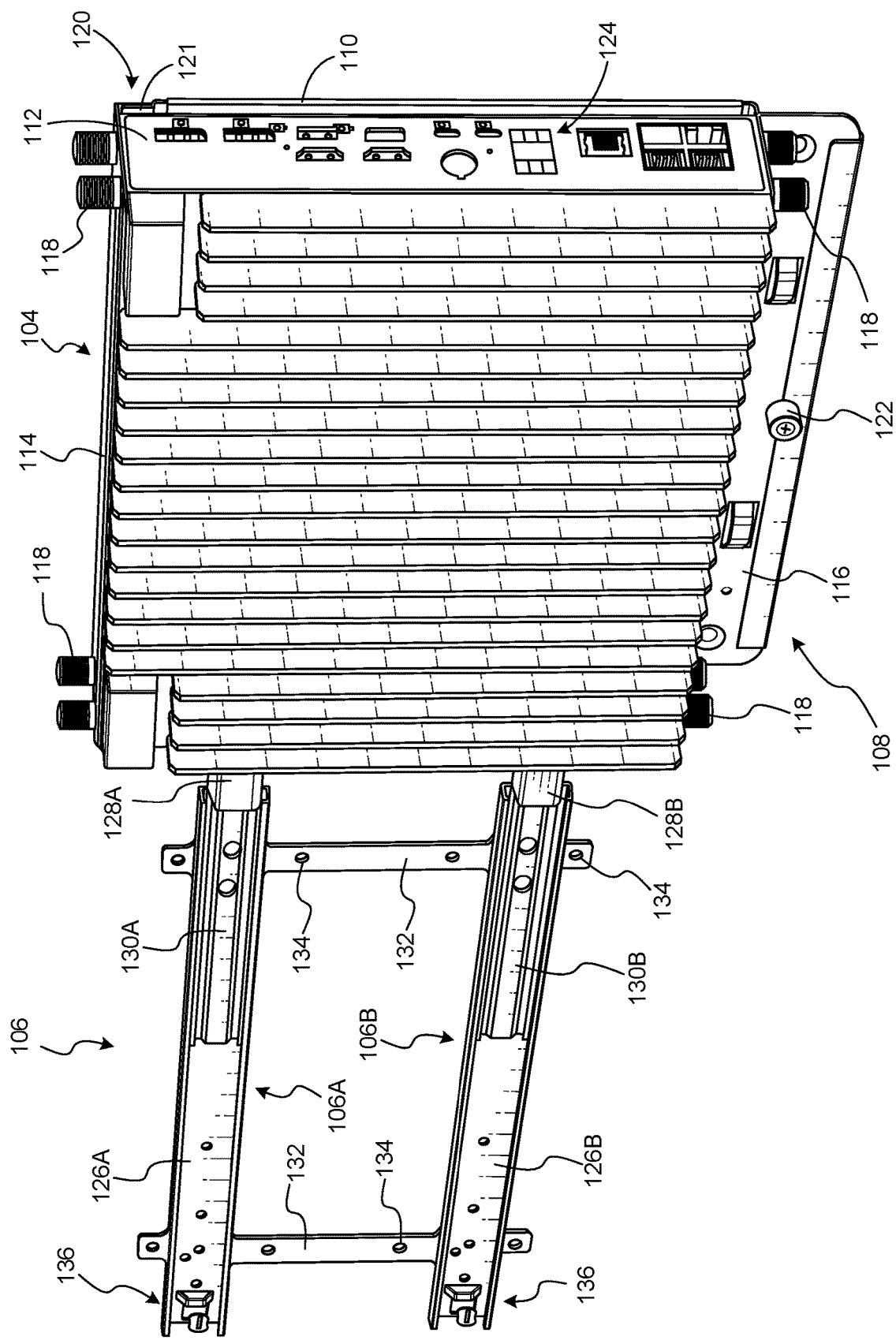
FIG. 2 is a front perspective view of a video-conferencing device and an example mounting system of the video-conferencing system of FIG. 1.

FIG. 2 illustrates a detailed front perspective view of the video-conferencing device 104 and the mounting system 108 of the video-conferencing system 100 of FIG. 1. As shown in FIG. 2 and as noted above, the top bracket 114 may be secured to an upper portion of the chassis 112 of the video-conferencing device 104 with, for example, thumb screws 118. The bottom bracket 116 may be secured to a lower portion of the chassis 112 with thumb screws 118. Thus, the chassis 112 may include holes (e.g., threaded holes) in locations configured for coupling the brackets 114, 116 thereto via the thumb screws 118.

The cradle 110 may be a generally plate-like member with features for removably coupling top bracket 114 and the bottom bracket 116 thereto, and for coupling to a mounting structure (e.g., the rail assembly 106). For example, as shown in FIG. 2, a portion of the top bracket 114 may be seated over an upper edge 120 of the cradle 110 when the video-conferencing device 104 is assembled with the mounting system 108. For example, an elongated protrusion 121 may extend along the upper edge 120. A portion of the bottom bracket 116 may abut against a lower portion of the cradle 110 and may be removably coupled to the cradle 110 with a fastener, such as a mounting thumb screw 122, a twist lock fastener, or a wing nut, for example. The cradle 110 may include a complementary feature, such as a hole (e.g., a threaded hole) and/or a nut for engagement with the mounting thumb screw 122 or another suitable fastener.

The video-conferencing device 104 may include a number of inputs and outputs 124, such as audio inputs and/or outputs and video inputs and/or outputs. By way of example and not limitation, the inputs and outputs 124 may include one or more of: power inputs, USB inputs and/or outputs, HDMI inputs and/or outputs, analog inputs and/or outputs, telephone cable inputs and/or outputs, ethernet cable inputs and/or outputs, coaxial cable inputs and/or outputs, wireless inputs and/or outputs, audio jack inputs and/or outputs, fiber optic cable inputs and/or outputs, or Bluetooth inputs and/or outputs, etc. The video-conferencing device 104 may also include (e.g., internally) one or more electronic devices for processing and/or transmitting incoming data for display on the video-conferencing display 102 and/or for providing a signal to corresponding audio devices (e.g., speakers). For example, the video-conferencing device 104 may include one or more of a video card, an audio card, a hard drive, a solid-state drive, a memory device, an application-specific integrated circuit (ASIC) device, a motherboard, a central processing unit, etc.

The rail assembly 106 may include, for example, an upper sliding rail 106A and a lower sliding rail 106B. The upper sliding rail 106A may include, for example, an upper base rail element 126A, an upper sliding rail element 128A, and an upper intermediate rail element 130A that may be slidably coupled to both the upper base rail element 126A and the upper sliding rail element 128A. In this manner, the upper sliding rail element 128A may be slidably coupled to the upper base rail element 126A via the upper intermediate rail element 130A. In additional embodiments, the upper sliding rail element 128A may be directly slidably coupled to the upper base rail element 126A and the upper intermediate rail element 130A may be absent. Similarly, the lower sliding rail 106B may include, for example, a lower base rail element 126B, a lower sliding rail element 128B, and a lower intermediate rail element 130B that may be slidably coupled to both the lower base rail element 126B and the lower sliding rail element 128B. In this manner, the lower sliding rail element 128B may be slidably coupled to the lower base rail element 126B via the lower intermediate rail element 130B. In additional embodiments, the lower sliding rail element 128B may be directly slidably coupled to the lower base rail element 126B and the lower intermediate rail element 130B may be absent.

The rail assembly 106 may also include one or more vertical support elements 132 extending between and coupled to the upper base rail element 126A and the lower base rail element 126B. For example, the vertical support elements 132 may maintain a parallel relationship between the upper and lower base rail elements 126A, 126B for improved extension and retraction of the rail assembly 106. Each of the vertical support elements 132 may also include one or more mounting holes 134, such as for securing the rail assembly 106 to a wall or other support structure.

In some embodiments, one or more locking mechanisms 136 may be positioned on each of base rail elements 126A, 126B. The locking mechanisms 136 may be configured to maintain the rail assembly 106 in a retracted, closed state in the absence of a sufficient applied opening force. The locking mechanisms 136 may, in some embodiments, be push-to-lock mechanisms. For example, the locking mechanisms 136 may engage with the respective upper and lower sliding rail elements 128A, 128B when the rail assembly 106 is pushed into a retracted, closed position. When a sufficient opening force is applied to the sliding rail elements 128A, 128B (e.g., by pushing or pulling on the video-conferencing device 104 away from the locking mechanisms 136), the locking mechanisms 136 may disengage with the sliding rail elements 128A, 128B to enable the rail assembly 106 to move toward an extended, open position (e.g., the position shown in FIG. 2).

Figure 3:
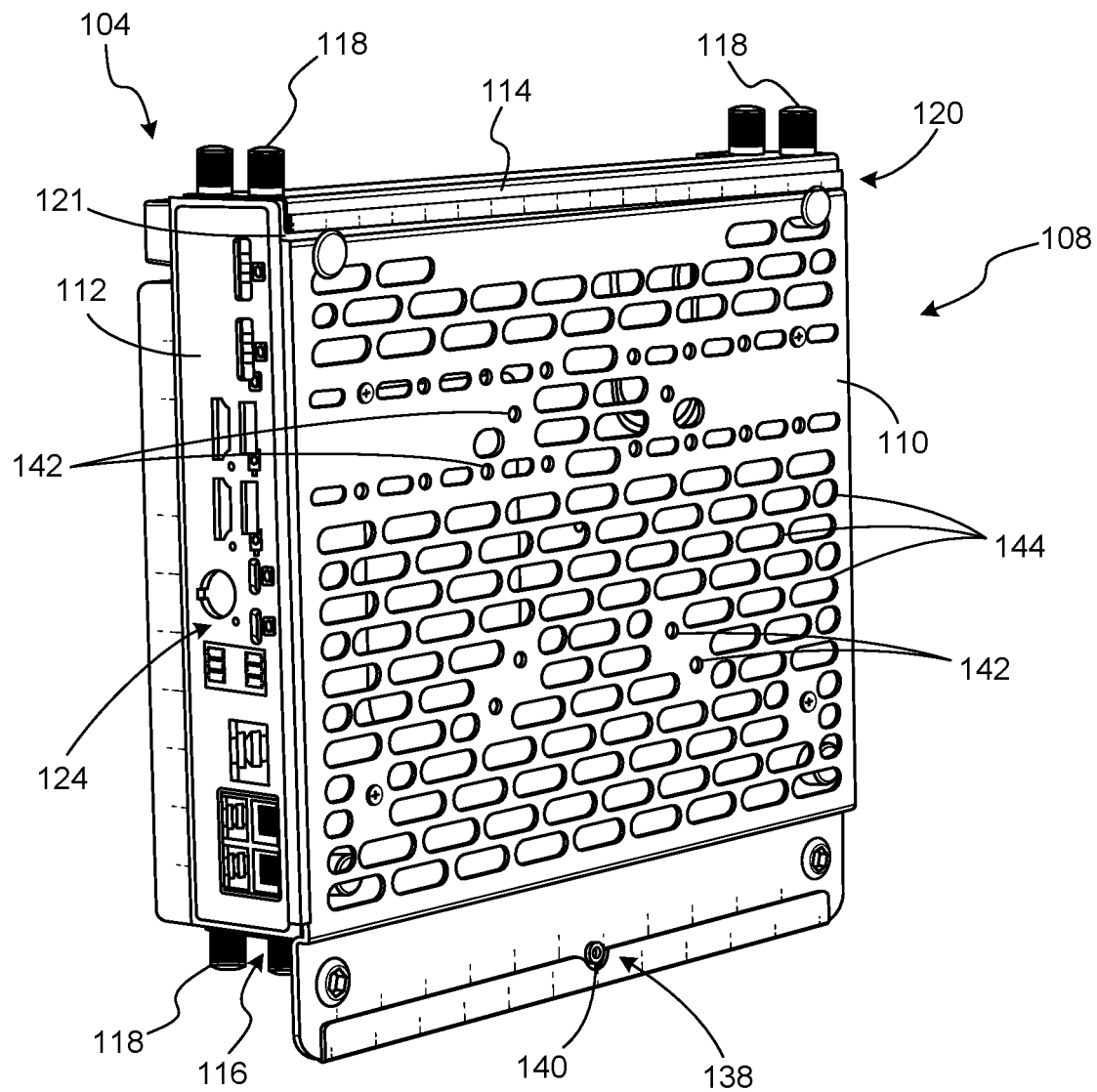
FIG. 3 is a rear perspective view of the video-conferencing device and mounting system of FIGS. 1 and 2, with a rail assembly removed for clarity.

FIG. 3 shows a rear perspective view of the video-conferencing device 104 and mounting system 108 of FIGS. 1 and 2, with the rail assembly 106 removed for clarity. As discussed above, the video-conferencing device 104 may include a chassis 112 and video and audio inputs and/or outputs 124. The top bracket 114 and the bottom bracket 116 may be secured to the chassis 112 with thumb screws 118, for example. A portion of the top bracket 114 may extend downward over the elongated protrusion 121 at the upper edge 120 of the cradle 110 when the video-conferencing device 104 is assembled with the cradle 110. A lower portion of the cradle 110 may include a securing hole 138 positioned to receive a fastener (e.g., the mounting thumb screw 122 (FIG. 2)) for removably coupling the bottom bracket 116 to the cradle 110. In some examples, a nut 140 may be positioned around the securing hole 138 so the mounting thumb screw 122 may engage with the nut 140. In additional examples, the securing hole 138 may be defined by a threaded surface for engaging with the mounting thumb screw 122 and the nut 140 may be absent.

The cradle 110 may be a generally planar element that is configured to support the video-conferencing device 104 and to be coupled to a wall or other support structure. The cradle 110 may include mounting holes 142 in various different positions for engaging with various different mounting structures, such as commercially available mounting structures. For example, mounting holes 142 may be positioned to engage with a wall, a VESA mount, a wall mount, a horizontal screen mount, and/or a sliding-rail mount. In addition, the cradle 110 may include ventilation holes 144 to facilitate cooling of the video-conferencing device during operation. The cradle 110 may be formed of a variety of different materials. For example, the cradle 110 may be formed of a metal, a polymer, or a fiber-matrix composite material.

Figure 4:
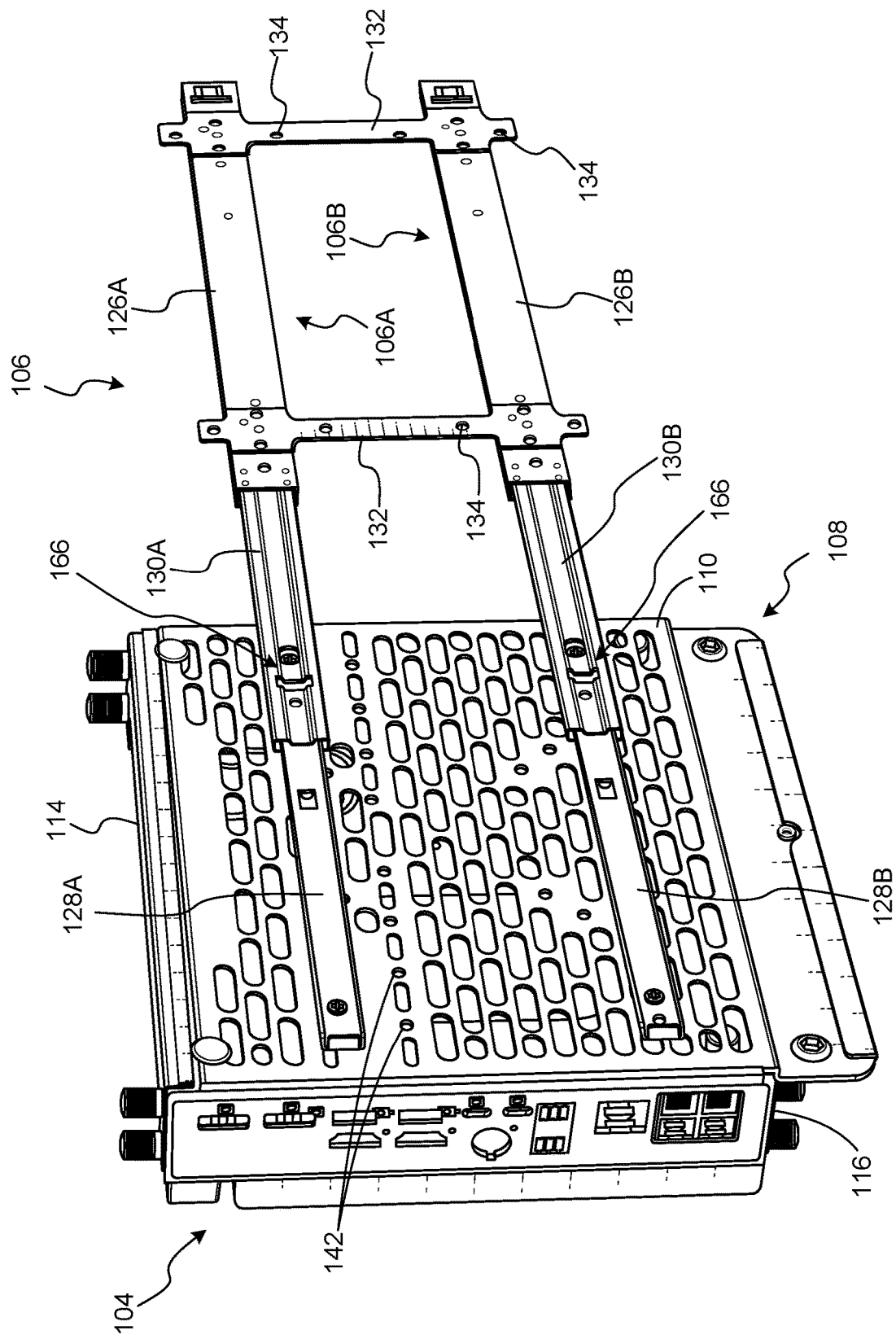
FIG. 4 is a rear perspective view of the video-conferencing device and mounting system of FIG. 3 attached to a sliding-rail mount.

FIG. 4 shows a rear perspective view of the assembled video-conferencing device 104 and mounting system 108 coupled to and supported by the rail assembly 106. As shown in FIG. 4, and as also described with reference to FIG. 2 above, the cradle 110 may be coupled to a rail assembly 106. In some embodiments, the rail assembly 106 may include the upper sliding rail 106A and the lower sliding rail 106B. The upper sliding rail 106A may include the upper base rail element 126A, the upper sliding rail element 128A, and the upper intermediate rail element 130A. Similarly, the lower sliding rail 106B may include the lower base rail element 126B, the lower sliding rail element 128B, and the lower intermediate rail element 130B. The sliding rail elements 128A, 128B may be coupled to the cradle 110 using at least some of the mounting holes 142 in the cradle 110.

The rail assembly 106 may also include one or more locking mechanisms 166 to maintain the rail assembly 106 in an extended, open position in the absence of a sufficient applied closing force. The locking mechanisms 166 may, in some embodiments, be pull-to-lock mechanisms. By way of example and not limitation, the locking mechanisms 166 may be configured to engage with the sliding rail elements 128A, 128B, with the intermediate rail elements 130A, 130B, and/or with the base rail elements 126A, 126B to maintain the rail assembly 106 in the open position. When a sufficient closing force is applied to the sliding rail elements 128A, 128B (e.g., by pushing or pulling on the video-conferencing device 104 toward the closed position), the locking mechanisms 166 may disengage to enable the rail assembly 106 to move toward the retracted, closed position.

Figure 5:
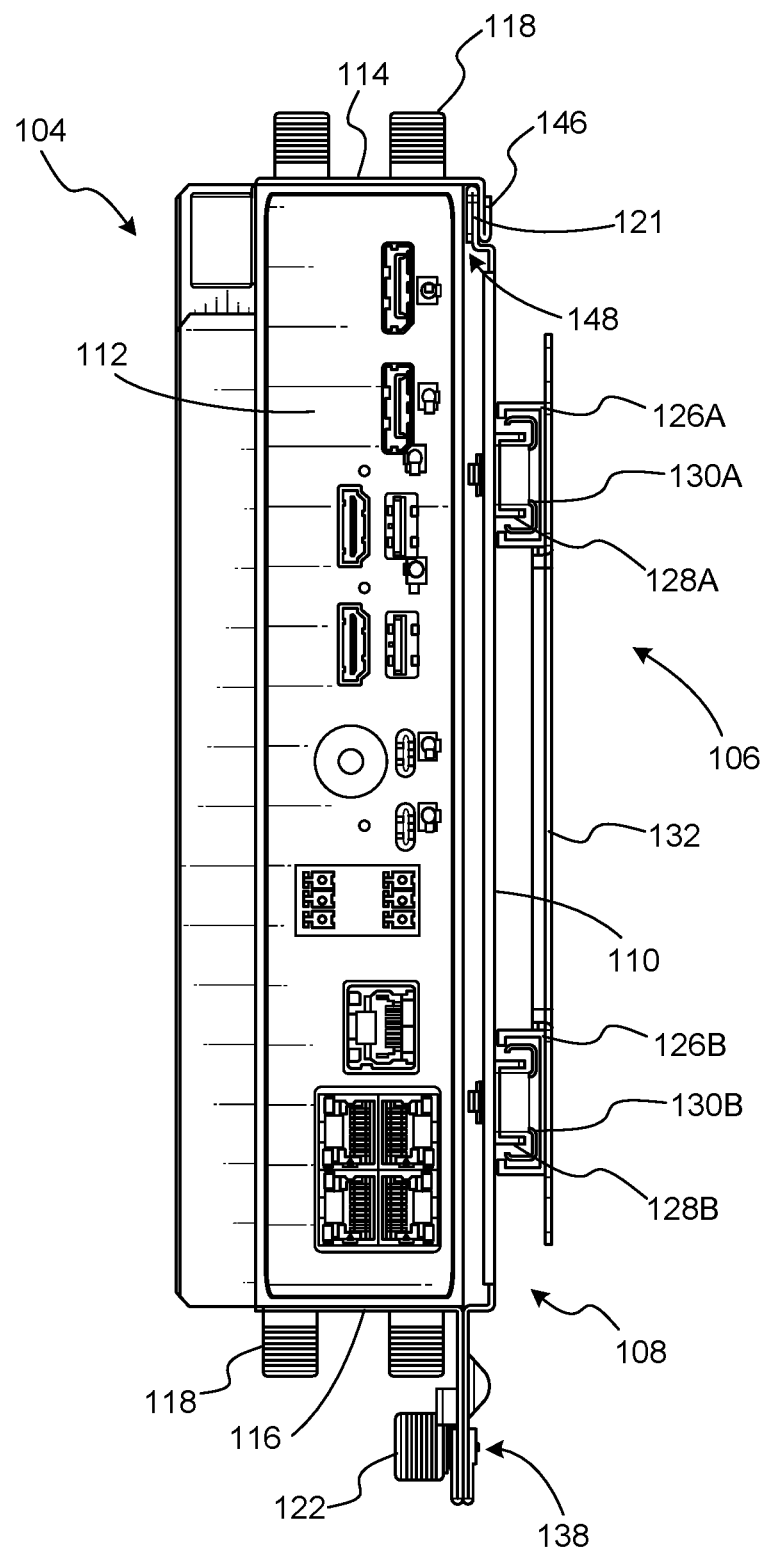
FIG. 5 is a side view of the video-conferencing device assembled with the mounting system and the rail assembly.

FIG. 5 is a side view of the video-conferencing device 104 assembled with the mounting system 108 and the rail assembly 106. As can be seen in FIG. 6, the elongated protrusion 121 of the cradle 110 may be positioned in a gap 148 defined by a surface of a downward lip 146 of the top bracket 114 and a back surface of the video-conferencing device 104. Thus, the top bracket 114 may be removably coupled to the cradle 110. In addition, the mounting thumb screw 122 may removably couple the bottom bracket 116 to the cradle 110 through the securing hole 138. The upper sliding rail element 128A and the lower sliding rail element 128B may each be coupled to the cradle 110 to support the cradle 110 and the video-conferencing device 104, such as relative to a support structure (e.g., a wall). In some examples, the sliding rail elements 128A, 128B may be coupled to the cradle 110 prior to the video-conferencing device 104 and the brackets 114, 116 are removably coupled to the cradle 110. The cradle 110 and/or the video-conferencing device 104 may be installed on the rail assembly 106 when the rail assembly 106 is in an extended position or in a retracted position.

FIG. 6 is a flow diagram that illustrates an example method 600 of mounting a video-conferencing device according to embodiments of the present disclosure. At operation 610, at least one base rail element may be coupled to a support structure at least partially behind a video-conferencing display. For example, as discussed above, the at least one base rail element may be coupled to a wall or other structure behind an electronic display or a projector screen. By way of example and not limitation, the at least one base rail element may be coupled to the support structure via a screw, a bolt, a support bracket, or another suitable device.

At operation 620, a cradle may be coupled to at least one sliding rail element that is slidably coupled to the at least one base rail element. The sliding rail element may be positioned and oriented to slide from a retracted position at least partially behind the video-conferencing display to an extended position at least partially exposed from behind the video-conferencing display.

At operation 630, a video-conferencing device may be coupled to the cradle that is coupled to the sliding rail element(s), such that the video-conferencing device is supported by the cradle and by the sliding rail element(s). For example, the video-conferencing device may be removably coupled to the cradle as described above for easy installation and removal, such as for replacement or maintenance.

At operation 640, the video-conferencing device may be slid with the sliding rail element into a position behind the video-conferencing display. For example, the video-conferencing device may be at least partially (i.e., partially or fully) out-of-view from the perspective of a user of a video-conferencing system including the video-conferencing device and the video-conferencing display. Nonetheless, the video-conferencing device may be accessible by sliding the rail assembly from a retracted, closed position into an extended, open position.

Accordingly, disclosed are systems and methods that facilitate accessing video-conferencing devices from behind video-conferencing displays, such as for installation, removal, maintenance, attachment of inputs or outputs, etc. In some examples and configurations, these actions may be performed without moving or removing the associated video-conferencing displays. In addition, accessing video-conferencing devices according to embodiments of this disclosure may be accomplished by a single person and without any significant physical effort.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A mounting system for a video-conferencing device, the mounting system comprising:

a rail assembly comprising at least one base rail element and at least one sliding rail element;

a cradle comprising an elongated protrusion, wherein the cradle is configured to couple to the sliding rail element; and at least one bracket comprising a downward lip at least partially defining a gap, wherein:

the bracket is configured to support a video-conferencing device and to couple to the cradle by the elongated protrusion of the cradle being positioned at least partially within the gap;

the cradle and the bracket are configured to removably couple to each other via the elongated protrusion and the downward lip coupling an upper portion of the cradle to the bracket and via a single removable fastener coupling a lower portion of the cradle to the bracket, wherein the single removable fastener is positioned to be accessible when the video-conferencing device is supported by the bracket such that removal of the single removable fastener when the video-conferencing device is supported by the bracket enables decoupling of the bracket and video-conferencing device from the cradle; and the sliding rail element, bracket, and cradle are, when assembled, positioned and configured to slide relative to and along the base rail element.

2. The mounting system of claim 1, wherein the rail assembly comprises an upper base rail element, an upper sliding rail element slidably coupled to the upper base rail element, a lower base rail element, and a lower sliding rail element slidably coupled to the lower base rail element.

3. The mounting system of claim 2, wherein the rail assembly further comprises at least one vertical support element configured to couple to and extend between the upper base rail element and the lower base rail element.

4. The mounting system of claim 1, wherein the rail assembly further comprises at least one intermediate rail element slidably coupled to the base rail element and to the sliding rail element.

5. The mounting system of claim 1, wherein the rail assembly further comprises at least one locking mechanism to hold the rail assembly in at least one of an extended position or a retracted position.

6. The mounting system of claim 5, wherein the at least one locking mechanism comprises a push-to-lock mechanism to hold the rail assembly in the retracted position when a sufficient closing force is applied to the sliding rail element in a direction toward the retracted position, and a pull-to-lock mechanism to hold the rail assembly in the extended position when a sufficient opening force is applied to the sliding rail elements in a direction toward the extended position.

7. The mounting system of claim 1, wherein the cradle is configured to couple to the sliding rail element via at least one fastener.

8. The mounting system of claim 1, wherein the cradle comprises a plurality of holes positioned for engagement with a plurality of different mounting structures.

9. A video-conferencing system, comprising:
a video-conferencing device comprising at least video and audio outputs and video and audio inputs;
a rail assembly comprising at least one base rail element and at least one sliding rail element, the rail assembly configured to position the video-conferencing device behind a video-conferencing display when in a retracted position and to position the video-conferencing device at least partially exposed relative to the video-conferencing display when in an extended position;
a cradle comprising an elongated protrusion, wherein the cradle is configured to couple to the sliding rail element;
at least one bracket comprising a downward lip at least partially defining a gap, wherein the bracket is configured to support the video-conferencing device on the rail assembly via the cradle by the elongated protrusion of the cradle being positioned at least partially within the gap; and
a single fastener removably coupling the at least one bracket to a lower portion of the cradle, wherein the single fastener is positioned to be accessible when the video-conferencing device is supported by the at least one bracket such that removal of the single fastener when the video-conferencing device is supported by the at least one bracket enables decoupling of the at least one bracket and video-conferencing device from the cradle.

10. The video-conferencing system of claim 9, wherein the at least one bracket comprises a top bracket comprising the downward lip that is configured to couple to a top portion of a chassis of the video-conferencing device and a bottom bracket that is configured to couple to a bottom portion of the chassis.

11. The video-conferencing system of claim 10, wherein each of the top bracket and the bottom bracket is configured to removably engage with the cradle.

12. The video-conferencing system of claim 9, wherein the cradle comprises at least two holes for coupling to the sliding rail element.

13. The video-conferencing system of claim 9, wherein the rail assembly is configured to position the video-conferencing device fully exposed relative to the video conferencing display when in the extended position.

14. The video-conferencing system of claim 9, wherein the rail assembly comprises an upper base rail element, an upper sliding rail element slidably coupled to the upper base rail element, a bottom base rail element, and a bottom sliding rail element slidably coupled to the bottom base rail element.

15. The video-conferencing system of claim 14, wherein the rail assembly further comprises:
an upper intermediate rail element that is slidably coupled to both the upper base rail element and the upper sliding rail element; and
a bottom intermediate rail element that is slidably coupled to both the bottom base rail element and the bottom sliding rail element.

16. The video-conferencing system of claim 14, wherein the cradle is configured to couple to both the upper sliding rail element and the bottom sliding rail element.

17. The video-conferencing system of claim 9, wherein the rail assembly further comprises at least one locking mechanism configured to retain the rail assembly in at least one of the retracted position or the extended position absent a sufficient external releasing force.

18. A method of mounting a video-conferencing device, the method comprising:
coupling at least one base rail element to a support structure at least partially behind a video-conferencing display;
coupling a cradle to at least one sliding rail element that is slidably coupled to the at least one base rail element;
coupling a video-conferencing device to a bracket comprising a downward lip, wherein the downward lip and a surface of the video-conferencing device define a gap;
removably coupling the video-conferencing device and the bracket to the cradle by positioning an elongated protrusion of the cradle within the gap and by securing the bracket to a lower portion of the cradle via a single fastener, wherein the single fastener is positioned to be accessible when the video-conferencing device is coupled to the bracket and when the elongated protrusion of the cradle is positioned within the gap, such that removal of the single fastener when the video-conferencing device is coupled the bracket and when the elongated protrusion of the cradle is positioned within the gap enables decoupling of the bracket and video-conferencing device from the cradle; and
sliding the video-conferencing device with the sliding rail element to a position behind the video-conferencing display.

19. The mounting system of claim 1, wherein the single fastener is selected from the group consisting of: a thumb screw, a twist lock fastener, or a wing nut.

20. The video-conferencing system of claim 9, wherein the cradle comprises a nut or a threaded hole that is complementary to the single fastener.

* * * * *